United States Patent
Pedoeem et al.

(10) Patent No.: US 12,250,788 B2
(45) Date of Patent: Mar. 11, 2025

(54) ENHANCED THERMAL MANAGEMENT IN ELECTRICAL BOXES USING PASSIVE COOLING

(71) Applicant: Crestron Electronics, Inc., Rockleigh, NJ (US)

(72) Inventors: Albert Pedoeem, West Orange, NJ (US); Kriss Replogle, Morristown, NJ (US); Charles Magrino, Cresskill, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 233 days.

(21) Appl. No.: 18/124,810

(22) Filed: Mar. 22, 2023

(65) Prior Publication Data

US 2024/0032237 A1    Jan. 25, 2024

Related U.S. Application Data

(63) Continuation-in-part of application No. 17/868,941, filed on Jul. 20, 2022, now Pat. No. 12,016,153.

(51) Int. Cl.
 *H05K 7/20*   (2006.01)
(52) U.S. Cl.
 CPC ..... *H05K 7/20172* (2013.01); *H05K 7/20409* (2013.01); *H05K 7/20436* (2013.01)
(58) Field of Classification Search
 CPC .... H02B 1/46; H02B 1/48; H02B 1/56; G06F 1/20; G06F 1/181; G06F 1/183;
 (Continued)

(56) References Cited

U.S. PATENT DOCUMENTS 6,226,182 B1 *   5/2001   Maehara ............ H05K 7/20127
                                                361/679.48
7,109,414 B2 *   9/2006   Reynolds ............... H02G 3/086
                                                      174/53

(Continued)

FOREIGN PATENT DOCUMENTS

EP    0887725 A1    12/1996
GB    2411050 A      8/2005

OTHER PUBLICATIONS

"OmniStreamTM Wallplate Networked AV Encoder", AT-OMNI-111-WP, (c) 2002 Atlona Inc., atlona.com.

*Primary Examiner* — Michael A Matey
(74) *Attorney, Agent, or Firm* — Crestron Electronics, Inc.

(57) ABSTRACT

An apparatus cools electronic circuitry. A housing encloses the electronic circuitry and includes a plurality of surfaces, each configured to face an adjacent inner wall of the back box upon the housing being mounted inside the back box. A rear surface faces a rear wall of the inner walls of the back box. A mounting plate is disposed opposite to the rear surface, is in thermal contact with the housing, and faces away from the back box. A touch plate is atop of, and in thermal contact with, the mounting plate. The mounting plate and the touch plate combine to provide a path for conducting heat generated by the electronic circuitry away from the housing and for radiating the heat to ambient air. The mounting plate or the touch plate is made of a higher thermal conductivity material to facilitate conduction of heat away from the housing.

20 Claims, 15 Drawing Sheets

(58) Field of Classification Search
CPC ...... G06F 2200/201; G06F 1/206; G06F 1/16; H05K 7/20172; H05K 7/20209; H05K 7/20409
See application file for complete search history.

(56) References Cited

U.S. PATENT DOCUMENTS

| | | | |
|---|---|---|---|
| 7,209,350 B2 | 4/2007 | Merlet et al. | |
| 8,503,183 B2* | 8/2013 | Hamilton | H05K 5/0017 361/728 |
| 8,724,331 B2* | 5/2014 | Chu | H02G 3/14 361/728 |
| 9,370,117 B2* | 6/2016 | Franck | H05K 7/14 |
| 10,958,026 B1* | 3/2021 | King | G01J 5/0205 |
| 2001/0052412 A1 | 12/2001 | Tikka | |
| 2007/0159791 A1* | 7/2007 | Pongracz | H05K 7/20145 361/688 |
| 2008/0151458 A1* | 6/2008 | Beland | G05D 23/1902 361/114 |
| 2008/0247125 A1* | 10/2008 | Davenport | H05K 5/0018 361/730 |
| 2009/0310301 A1 | 12/2009 | Nelson et al. | |
| 2010/0182262 A1* | 7/2010 | Yoshikawa | G09G 3/2096 345/173 |
| 2012/0068832 A1* | 3/2012 | Feldstein | G06F 1/1632 340/12.5 |
| 2012/0299728 A1* | 11/2012 | Kirkpatrick | G06Q 10/109 340/541 |
| 2015/0096239 A1* | 4/2015 | Frogness | E04F 19/08 248/231.91 |
| 2015/0153109 A1 | 6/2015 | Reytblat et al. | |
| 2017/0187155 A1* | 6/2017 | Jansen | H05K 5/0286 |
| 2017/0290195 A1* | 10/2017 | Jansen | H01R 24/76 |
| 2017/0354060 A1* | 12/2017 | Pedoeem | H05K 7/20145 |
| 2018/0235366 A1* | 8/2018 | Pyle | A47B 67/02 |
| 2020/0008317 A1* | 1/2020 | Pedoeem | H05K 7/20545 |
| 2023/0419672 A1* | 12/2023 | Prendergast | G06V 40/172 |

* cited by examiner

ENHANCED THERMAL MANAGEMENT IN ELECTRICAL BOXES USING PASSIVE COOLING

CROSS-REFERENCE TO RELATED APPLICATIONS

This application is a continuation-in-part of U.S. patent application Ser. No. 17/868,941, filed Jul. 20, 2022, the disclosure of which is incorporated herein by reference.

BACKGROUND OF THE INVENTION

Technical Field

The present embodiments relate to electrical boxes and, more particularly, to the thermal management of the electronic circuitry contained in electrical boxes.

Background Art

Electrical boxes are employed in many applications where a wall-mounted control device is desired. For example, a keypad, a lighting dimmer, a lighting switch, or an electronics switch may be encased within an electrical box. Various wires or cables may extend from the electrical box to provide power and/or data connections to the devices enclosed within the electrical box.

In many of these applications, the electronic circuitry employed generates heat which can potentially damage the circuitry if allowed to build up within the enclosure of the electrical box. The generated heat must therefore be directed to outside of the enclosure to maintain a suitable operating temperature. In a known arrangement, for example, a heat sink is provided that is in thermal contact with the circuitry and draws heat away from the circuitry. The heat sink may further be in contact with one or more walls of the enclosure to permit the heat drawn from the circuitry to escape into the surrounding ambient.

As more features are added, additional and/or denser circuitry is often required to support the added features. The increase in the amount of or the density of the circuitry results in increased being heat generated within the electrical box. Therefore, more heat must be drawn away from the circuitry. This increase in thermal load is beyond the ability of the known arrangements to remove the heat generated.

It is therefore desirable to provide better removal of the heat generated by the electronic circuitry contained within the electrical box to provide improved thermal management of such circuitry.

SUMMARY OF THE INVENTION

It is to be understood that both the general and detailed descriptions that follow are exemplary and explanatory only and are not restrictive.

Disclosure of Invention

In accordance with an aspect, an apparatus for cooling electronic circuitry comprises (a) a housing configured to enclose the electronic circuitry and being mountable inside a back box, the housing including (1) a plurality of surfaces, each one of the plurality of surfaces being configured to face an adjacent one of a plurality of inner walls of the back box upon the housing being mounted inside the back box, the plurality of surfaces including (A) a rear surface configured to face a rear wall of the plurality of inner walls of the back box upon the housing being mounted inside the back box; (b) a mounting plate disposed opposite to the rear surface, the mounting plate being in thermal contact with the housing and being configured to face away from the back box upon the housing being mounted inside the back box; and (c) a touch plate disposed atop of, and in thermal contact with, the mounting plate, wherein (1) the mounting plate and the touch plate combine to provide a path for conducting heat generated by the electronic circuitry away from the housing and for radiating the heat to ambient air, and (2) one of the mounting plate or the touch plate is made of a material that has a higher thermal conductivity than another of the mounting plate or the touch plate to facilitate the conduction of the heat away from the housing.

According to a further aspect, an apparatus for cooling electronic circuitry comprises (a) a housing configured to enclose the electronic circuitry and being mountable inside a back box, including (1) a plurality of surfaces, at least one of the plurality of surfaces being configured to face an adjacent one of a plurality of inner walls of the back box upon the housing being mounted inside the back box, whereby an air gap is formed between that surface and its adjacent one of the plurality of inner walls; and (b) a thermal interface material disposed on one of the at least one of the plurality of surfaces or the at least one adjacent inner wall of the back box, wherein (1) upon the housing being mounted inside the back box, the thermal interface material fills at least part of the air gap formed between the at least one of the plurality of surfaces of the housing and its adjacent inner wall of the back box and thereby provides a path for heat generated by the circuitry to flow from the housing to the back box.

According to another aspect, a method of cooling electronic circuitry comprises (a) a housing configured to enclose the electronic circuitry and being mountable inside a back box, the housing including (1) a plurality of surfaces, at least one of the plurality of surfaces being configured to face an adjacent one of a plurality of inner walls of the back box upon the housing being mounted inside the back box, whereby an air gap is formed between the at least one of the plurality of surfaces and an adjacent one of the plurality of inner walls; and (b) at least one expandable, thermally conductive element mounted on one of (i) the at least one of the plurality of surfaces of the housing or (ii) the adjacent one of the plurality of inner walls of the back box, wherein (1) upon the housing being mounted inside the back box, the at least one expandable, thermally conductive element expands across the air gap and provides a path for heat generated by the electronic circuitry to flow from the housing to the back box.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1:
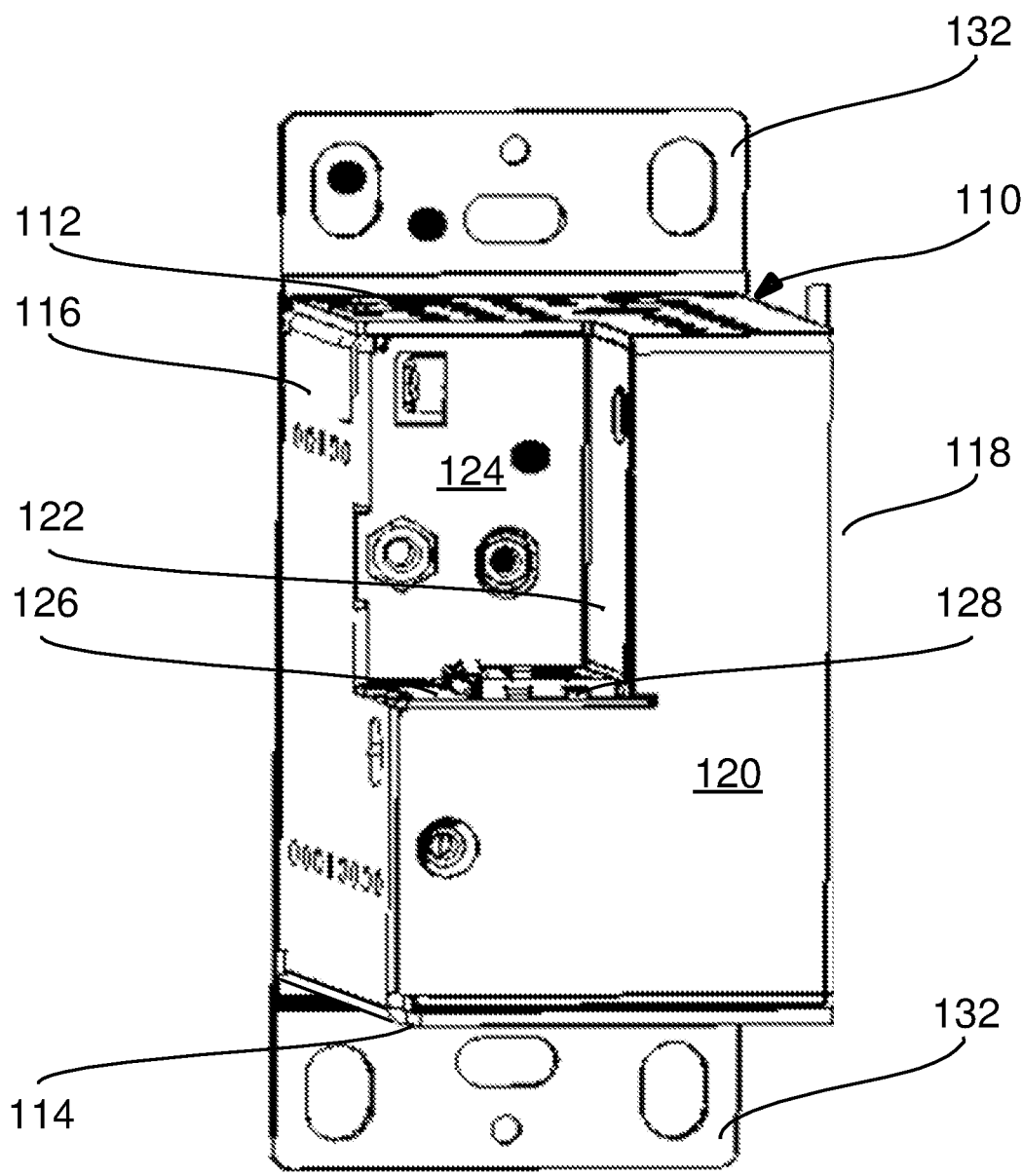

FIG. 1 is a rear perspective view of a known electrical box.

Figure 2:
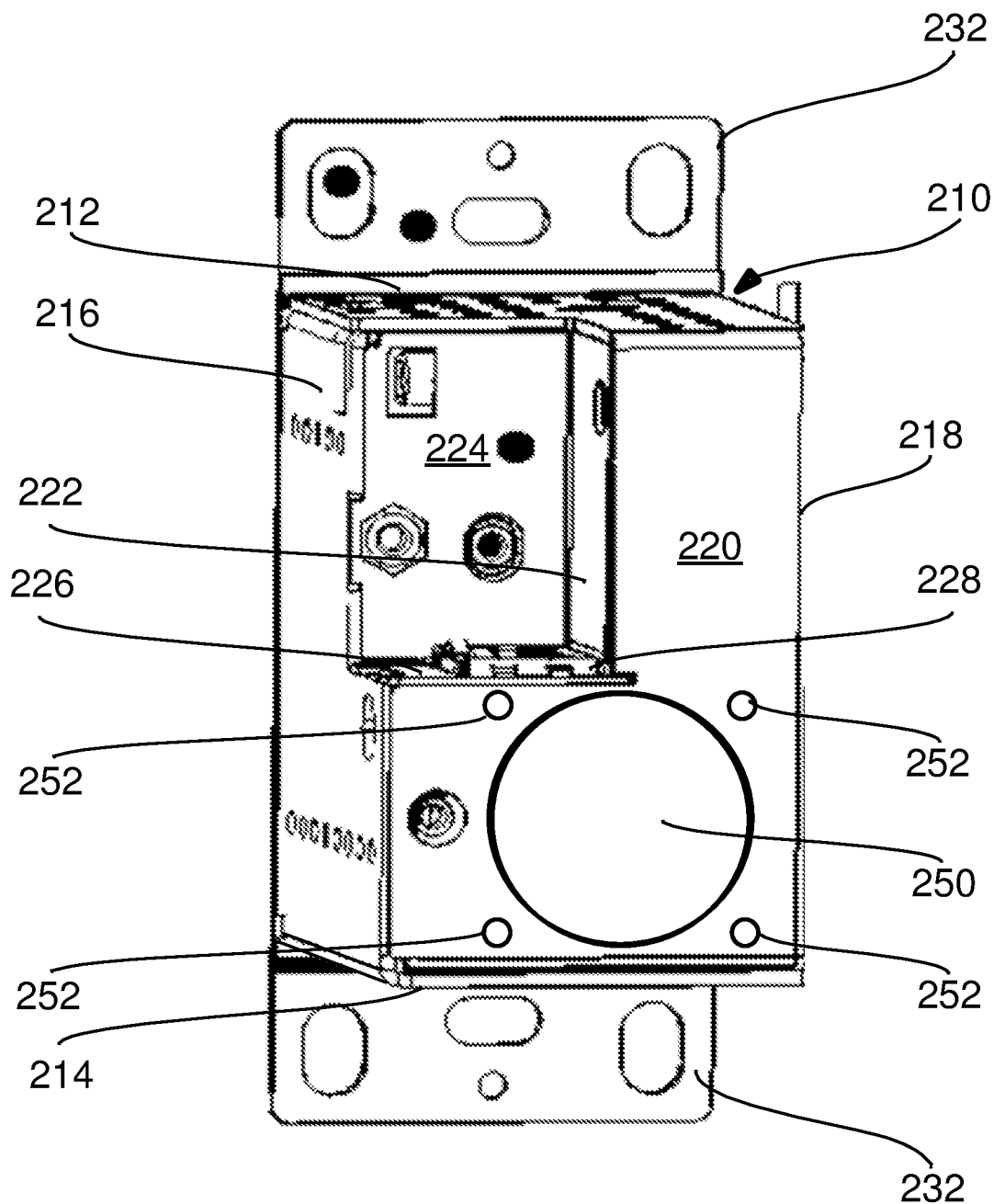

FIG. 2 is a rear perspective view of an electrical box in accordance with an embodiment.

Figure 3:
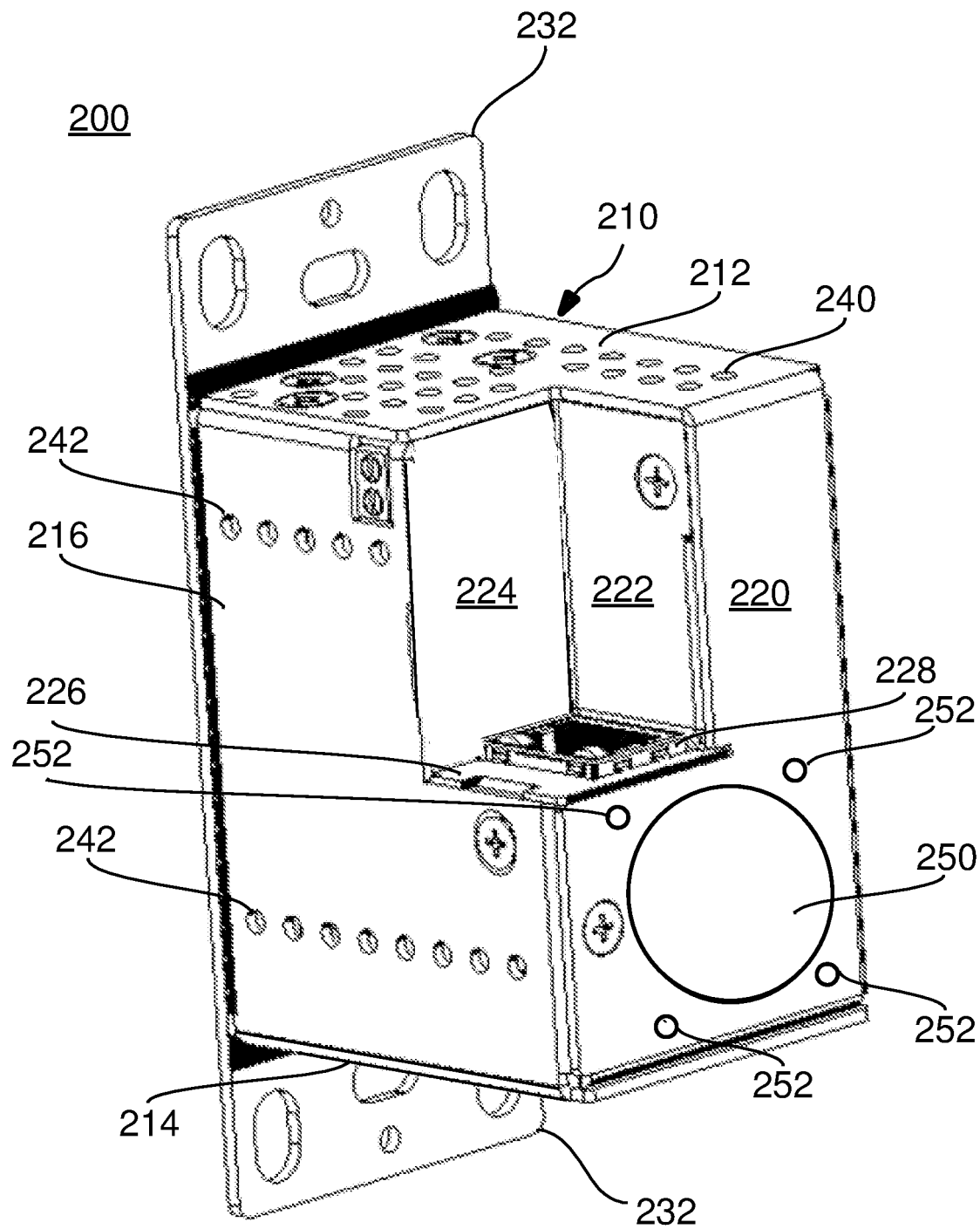

FIG. 3 is another rear perspective view of the electrical box of FIG. 2.

Figure 4:
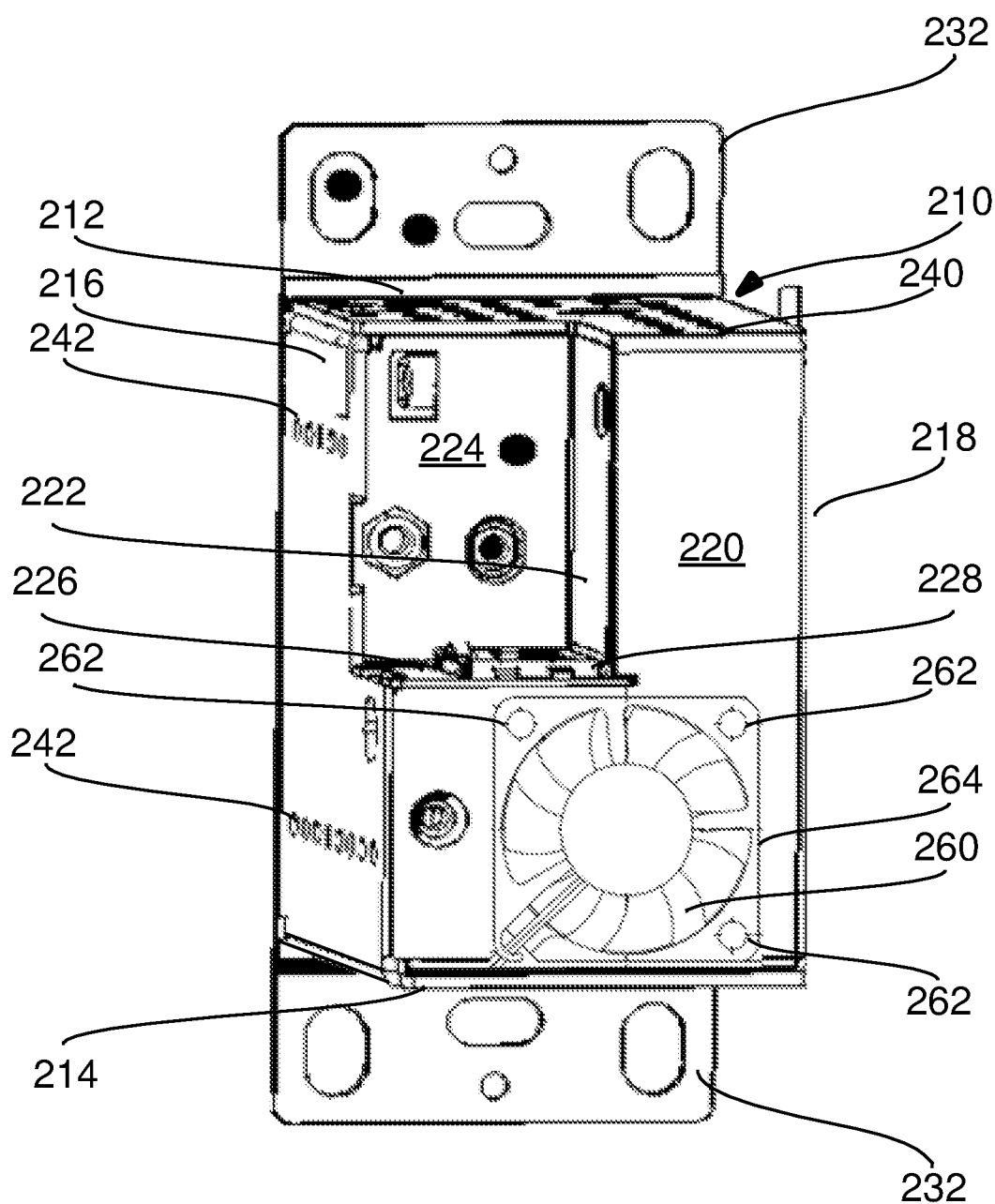

FIG. 4 is a rear perspective view of the electrical box of FIGS. 2 and 3 incorporating an axial fan in accordance with an embodiment.

Figure 5A:
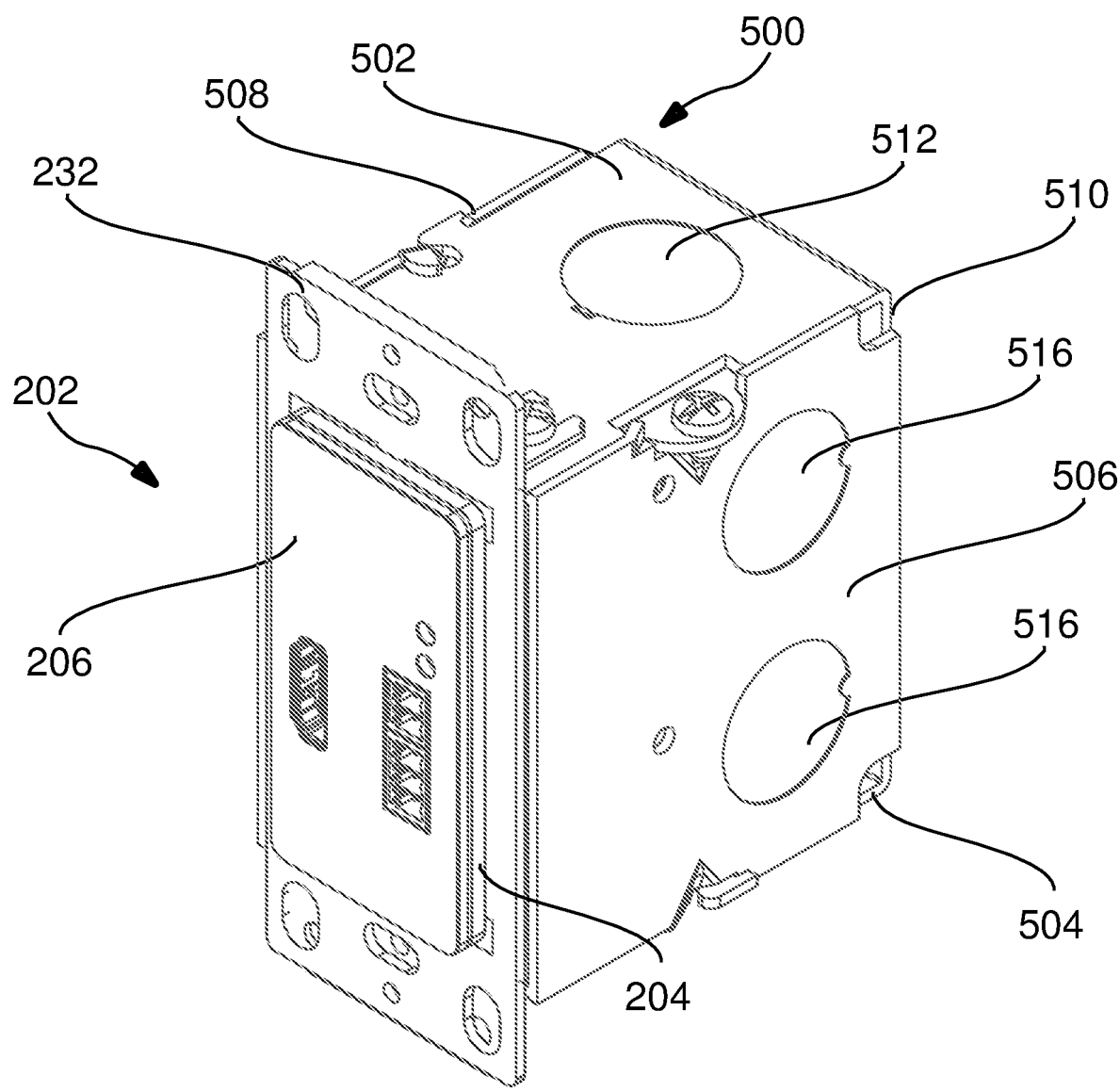

FIG. 5A is a front perspective view of an electrical box mounted within a back box in accordance with an embodiment.

Figure 5B:
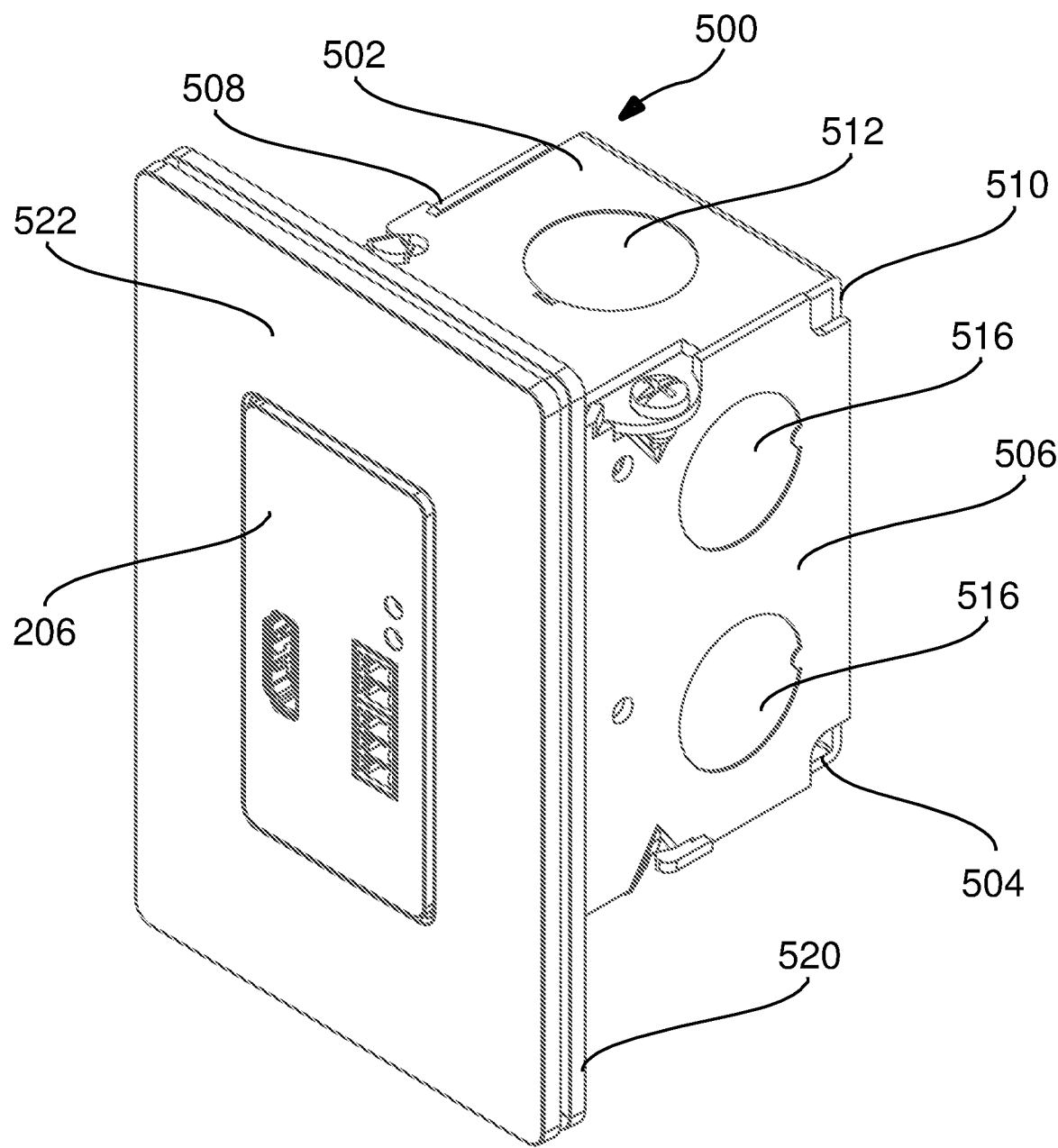

FIG. 5B is a front perspective view of the electrical box and back box of FIG. 5A with a mounting plate and a touch plate in accordance with an embodiment.

Figure 6:
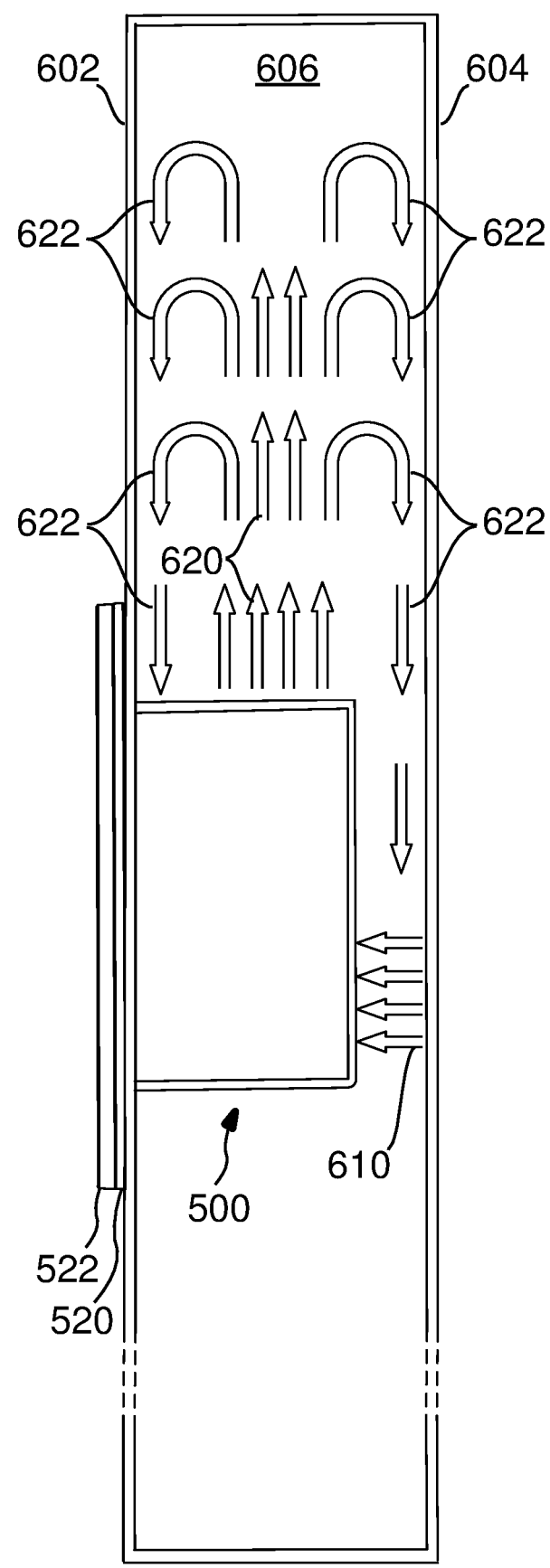

FIG. 6 is a side view of the back box of FIGS. 5A and 5B mounted in a wall cavity and showing the circulation of air within the wall cavity in accordance with an embodiment.

Figure 7:
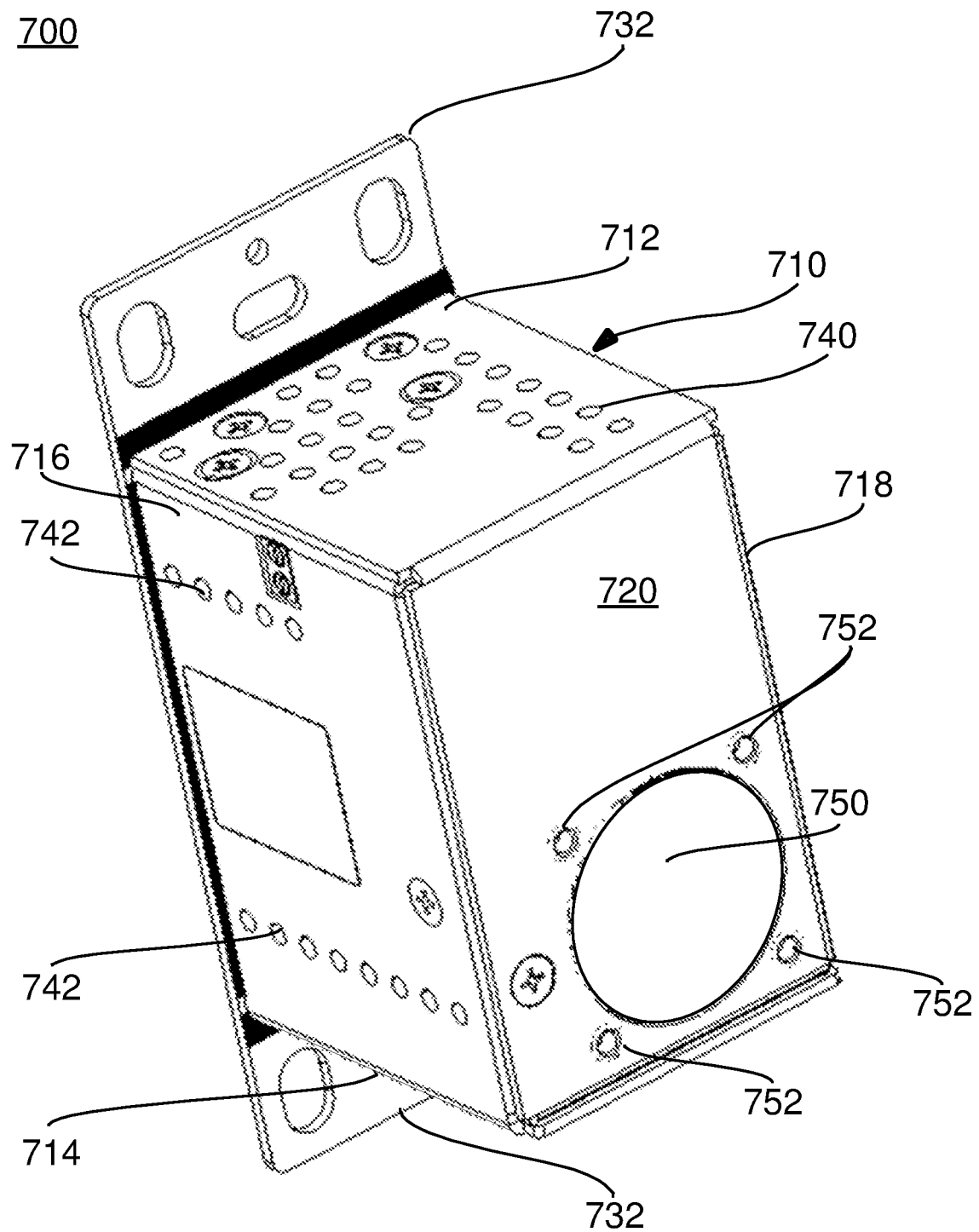

FIG. 7 is a rear perspective view of an electrical box in accordance with yet another embodiment.

Figure 8A:
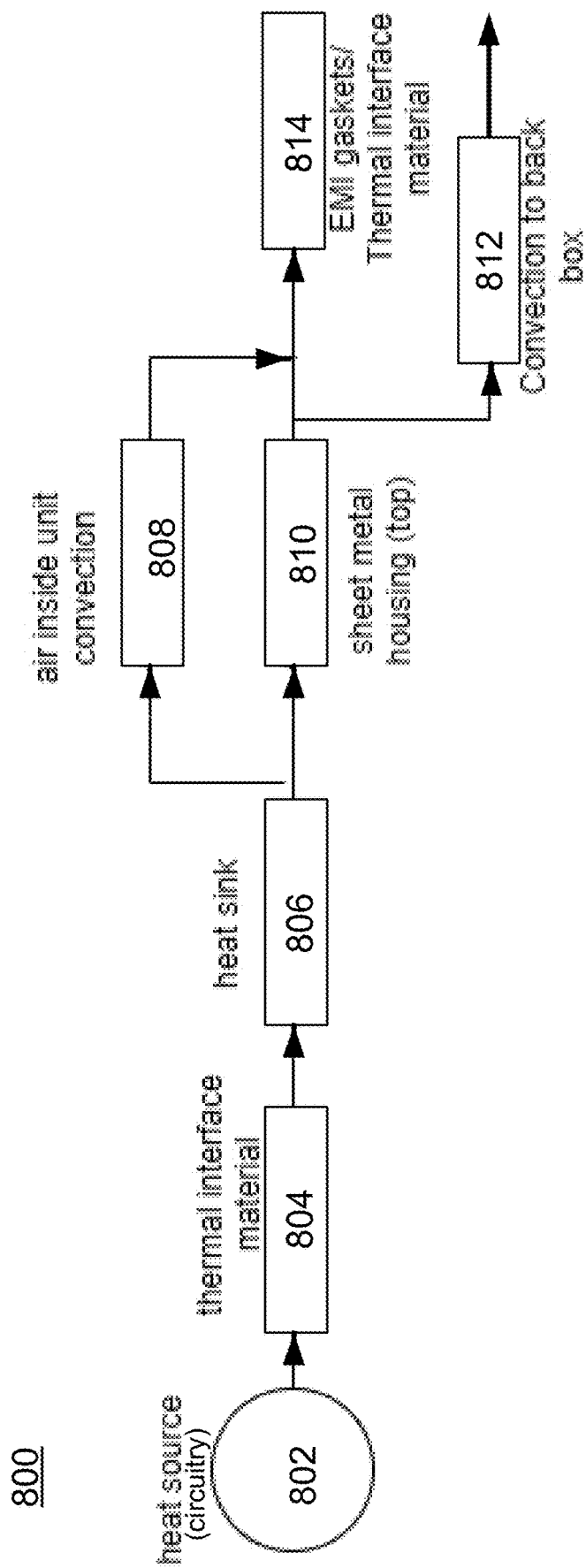
Figure 8B:
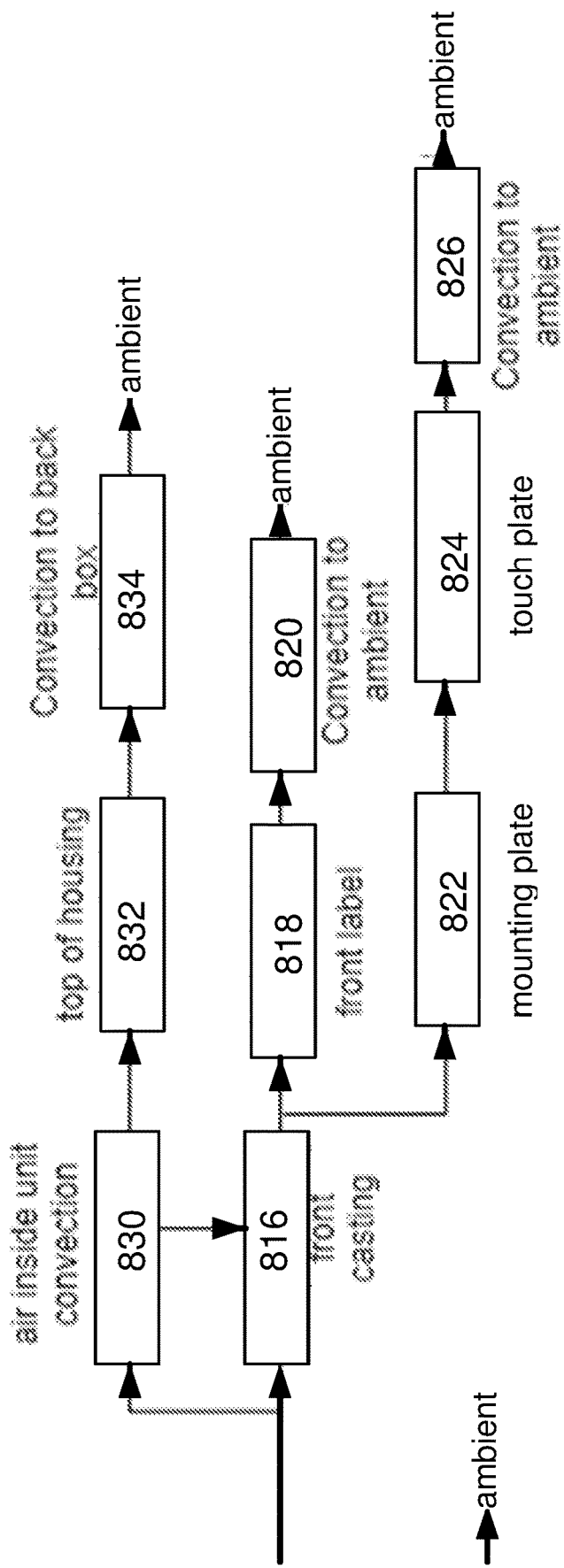

FIGS. 8A-8B are schematic diagrams showing an example of heat flow within and from an electrical box in accordance with an embodiment.

Figure 9:
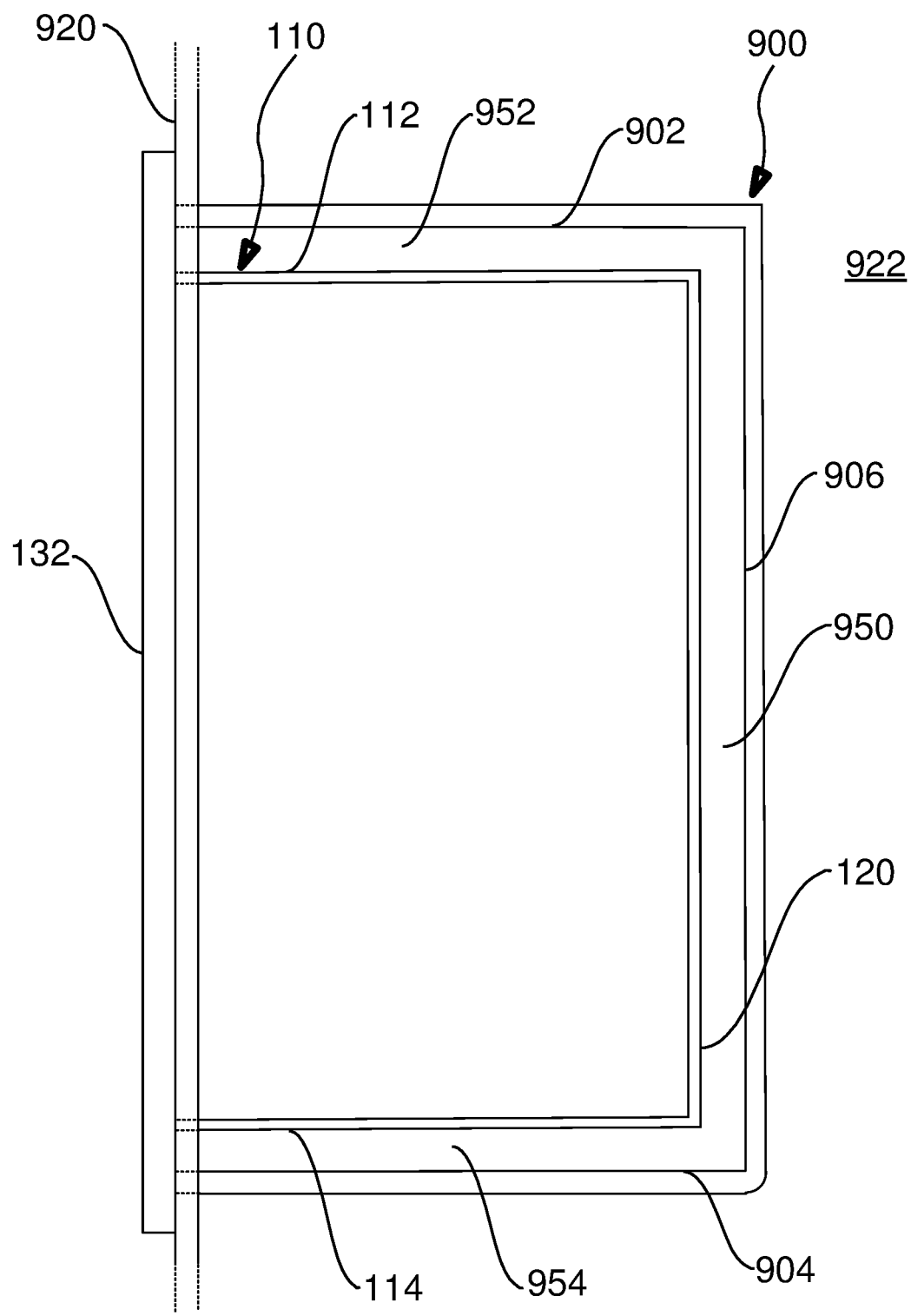

FIG. 9 is a cross-sectional side view of a known electrical box mounted in a known back box which is, in turn, mounted in a wall cavity.

Figure 10A:
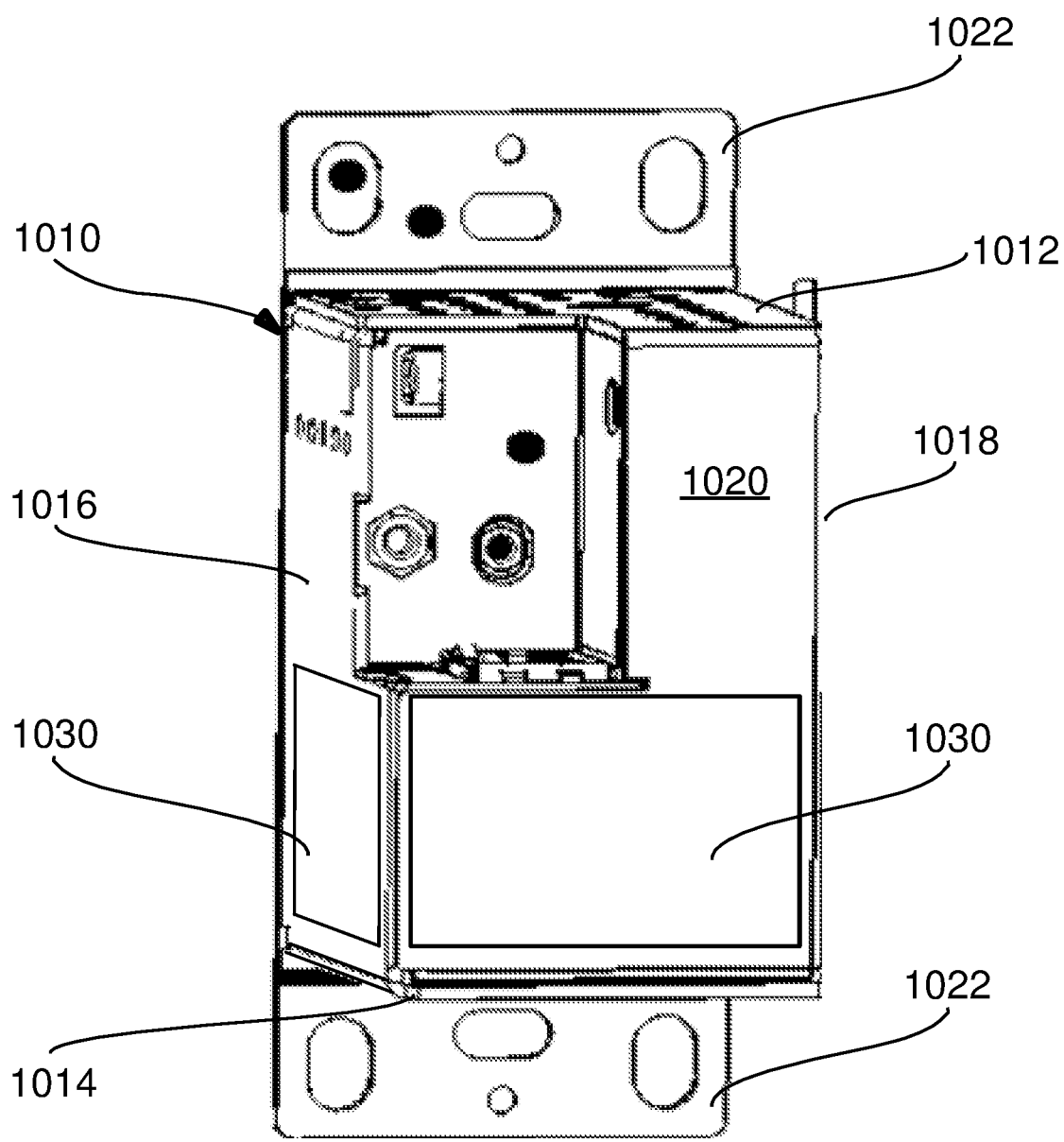
Figure 10B:
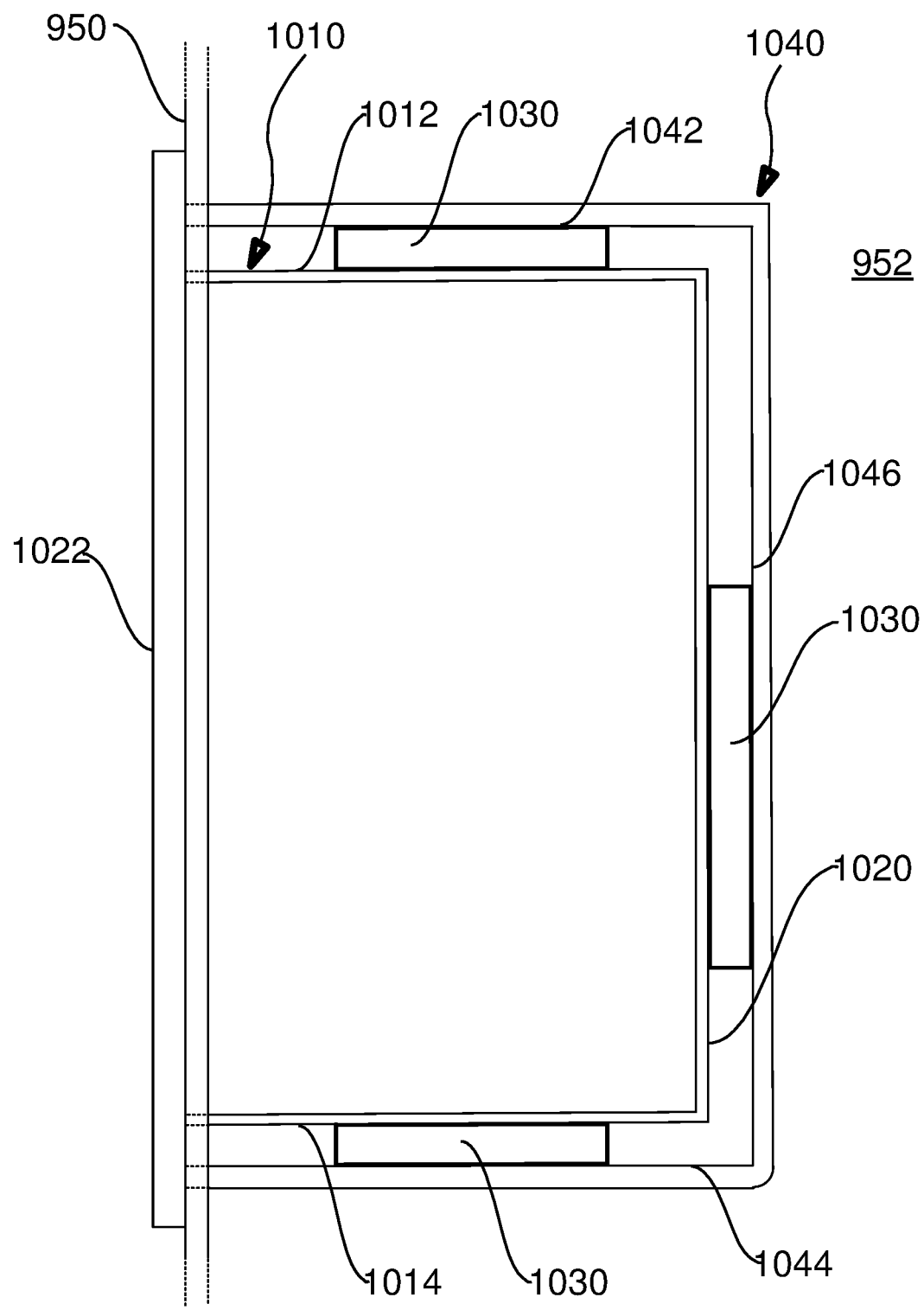

FIG. 10A is a rear perspective view of a passive cooling arrangement for electrical box in accordance with an embodiment, and FIG. 10B is a cross-sectional side view of the passive cooling arrangement in accordance with the embodiment.

Figure 11A:
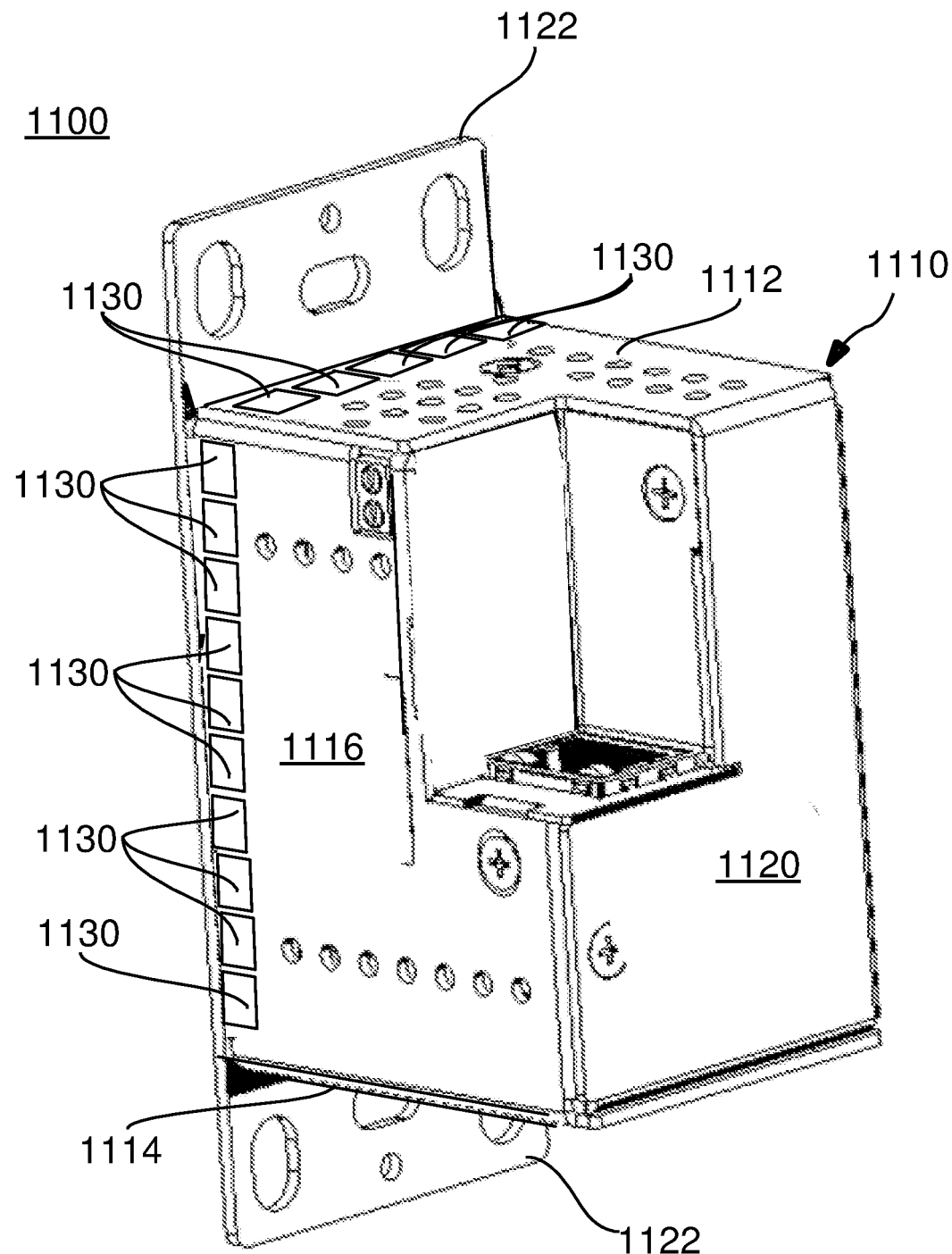
Figure 11B:
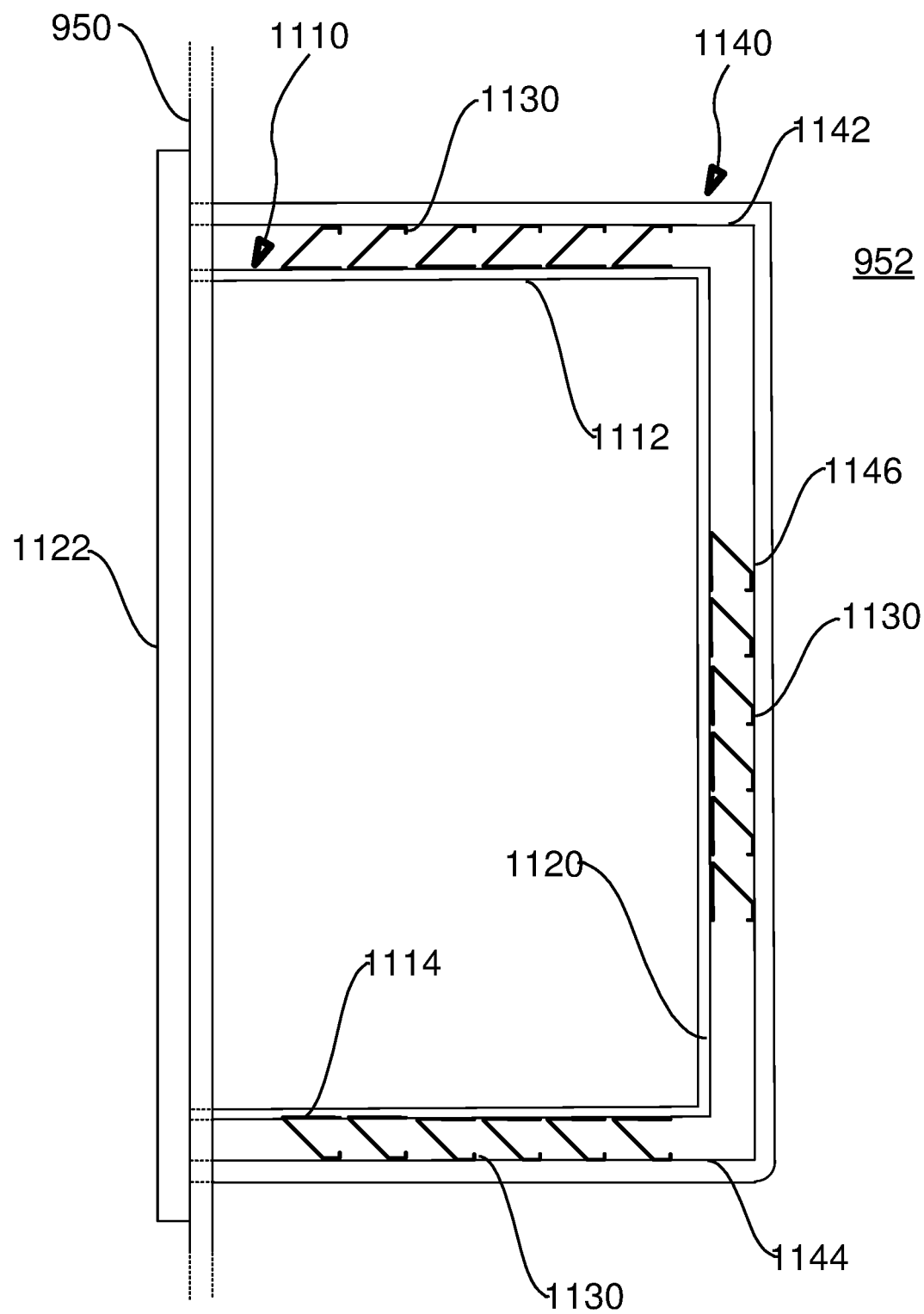

FIG. 11A is a rear perspective view of a passive cooling arrangement for electrical box in accordance with another embodiment, and FIG. 11B is a cross-sectional side view of the passive cooling arrangement in accordance with the embodiment.

DETAILED DESCRIPTION OF THE INVENTION

The present embodiments provide improved thermal management of electronic circuitry contained in an enclosure such as an electrical box.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.

100 Known Electrical box
110 Housing
112 Top Surface
114 Bottom Surface
116 Side Surface
118 Side Surface
120 Rear Surface
122 Intermediate Side Surface
124 Intermediate Rear Surface
126 Intermediate Bottom Surface
128 Receptacle
132 Mounting Plate
140 Top Vent Holes
142 Side Vent Holes
200 Electrical Box
202 Front of Electrical Box
204 Front Casting
206 Label
210 Housing
212 Top Surface
214 Bottom Surface
216 Side Surface
218 Side Surface
220 Rear Surface
222 Intermediate Side Surface
224 Intermediate Rear Surface
226 Intermediate Bottom Surface
228 Receptacle
232 Mounting Plate
240 Top Vent Holes
242 Side Vent Holes
250 Fan Hole
252 Fan Mounting Holes
260 Fan
262 Fan Mounting Screws
264 Fan Housing
500 Back Box
502 Top Surface
504 Bottom Surface
506 Side Surface
508 Side Surface
510 Rear Surface
512 Knock Out Plate
516 Knock Out Plate
520 Touch Plate
522 Outer Mounting Plate
602 First Wall
604 Second Wall
606 Cavity
610 Cooling Air
620 Heated Air
622 Re-cooled Air
700 Electrical box
702 Front Casting
704 Wall Plate
706 Cover Plate
708 Mounting Plate
710 Housing
712 Top Surface
714 Bottom Surface
716 Side Surface
718 Side Surface
720 Rear Surface
730 Gasket
732 Mounting Plate
740 Top Vent Holes
742 Side Vent Holes
750 Fan Hole
752 Fan Mounting Holes
760 Fan
762 Fan Mounting Screws
764 Fan Housing
800 Heat Flow
802 Heat Source
804 Thermal Interface Material
806 Heat Sink
808 Convection Inside Housing
810 Sheet Metal Housing
812 Convection to Back Box
814 Gasket
816 Front Casting
818 Mounting Plate 822 Convection to Ambient
824 Touch Plate
826 Convection to Ambient
830 Convection of Air Inside Unit
832 Top of Housing
834 Convection to Back Box
900 Back Box
902 Top Surface
904 Bottom Surface
906 Rear Surface
920 Wall
922 Wall cavity
950 Air Gap
952 Air Gap
954 Air Gap
1000 Passive Cooling Arrangement
1010 Housing
1012 Top Surface
1014 Bottom Surface
1016 Side Surface
1018 Side Surface
1020 Rear Surface
1022 Mounting Plate
1030 Thermal Interface Material
1040 Back Box
1042 Top Surface
1044 Bottom Surface
1046 Rear Surface
1100 Passive Cooling Arrangement
1110 Housing
1112 Top Surface
1114 Bottom Surface
1116 Side Surface
1120 Rear Surface
1122 Mounting Plate
1130 Spring Finger Element
1140 Back Box
1142 Top Surface
1144 Bottom Surface
1146 Rear Surface

MODE(S) FOR CARRYING OUT THE INVENTION

The embodiment described herein in the context of an electrical box, but is not limited thereto, except as may be set forth expressly in the appended claims.

Referring first to FIG. 1, a rear perspective view of a known electrical box 100 is shown. The electrical box 100 includes a housing 110 having a top surface 112 and an opposing bottom surface 114. A rear surface 120 is disposed between the top surface 112 and the bottom surface 114. Side surfaces 116 and 118 are disposed between the side edges of the top surface 112 and the bottom surface 114.

An intermediate side surface 122 may be disposed part way between the side surfaces 116 and 118 and may be generally parallel with the side surfaces. An intermediate rear surface 124 may be disposed part way from the rear surface 120 and may be generally parallel with the rear surface. An intermediate bottom surface 126 may be disposed part way between the top surface 112 and the bottom surface 114 and may be generally parallel with the top and bottom surfaces. A receptacle 128 may be disposed in the intermediate bottom surface 126 and configured to receive a connector which may be a data connector and/or a power connector.

A mounting plate 132 extends from the housing 110 and is provided to enable the housing 110 to be secured to a wall or a front mounting plate (not shown). A gasket (not shown) may be also provided between the mounting plate 132 and the front mounting plate or wall.

FIGS. 2-4 show an electrical box 200 according to an embodiment. FIG. 2 is a rear perspective view of the electrical box 200. The electrical box 200 includes a housing 210 having a top surface 212, a bottom surface 214, a rear surface 220 disposed between the top surface 212 and the bottom surface 214 at the ends thereof, and side surfaces 216 and 218 disposed between the top surface 212 and the bottom surface 214 at their side edges.

An intermediate side surface 222 may be disposed part way between the ide surfaces 216 and 218 and may be generally parallel with the side surfaces. An intermediate rear surface 224 may be disposed part way from the rear surface 220 and may be generally parallel with the rear surface. A bottom intermediate surface 226 may be disposed part way between the top surface 212 and the bottom surface 214 and may be generally parallel with the top surface 212 and the bottom surface 214. An electrical or electronics receptacle 228 may be disposed in the bottom intermediate surface 226.

A mounting plate 232 is provided to secure the housing 210 to a front mounting plate (not shown). A gasket (not shown) may be provided between the front mounting plate and mounting plate 232 of the housing 210.

In accordance with the embodiment, the rear surface 220 includes an opening or fan hole 250 over which an axial fan or the like may be located to provide cooling. The rear surface 220 further includes mounting holes 252 which may be threaded for receiving screws to secure the fan to the rear surface 220.

FIG. 3 shows another view of the electrical box 200 showing examples of vent holes that may be formed in the housing 210. A plurality of top vent holes 240 are formed in the top surface 212. Additionally, a plurality of side vent holes 242 may be formed in one or both of the side surfaces 216 and 218.

FIG. 4 shows the electrical box 200 with a fan 260 disposed over the fan hole 250. The fan 260 is mounted in a housing 264 which is secured to the rear surface 220 of the housing 210 using screws 262. The screws 262 are turned into the holes 252 shown in FIGS. 2 and 3. The fan 260 may be an axial flow fan, namely, a fan in which the extracted air is forced to move parallel to the shaft about which the blades rotate. Alternatively, the fan 260 may be a centrifugal fan or other type of fan.

The fan 260 draws cooling air from outside the housing 210 into the interior of the housing 210 where the air circulates over the various electronic components located therein to draw heat away from these components. A heat sink (not shown) may also be provided to draw heat from the electronic components as well as a thermal interface material (not shown) disposed between the heat source and the heat sink. The fan 260 circulates cooling air over the heat sink to remove heat from the heat sink. The heated air is then directed at least through the top holes 240 and, when the side holes 242 are present, the heated air is also directed through the side holes 242. Additionally, while air circulates within the housing 210, some of the heat from the heated air may transfer through the walls of the housing 210 to outside of the housing 210.

FIG. 5A is a front perspective view of the electrical box 200 when mounted within a back box 500 in accordance with an embodiment.

A front side 202 of the electrical box 200 includes a front casting 204 which is secured to the mounting plate 232 of the housing 110. A label 206 is then attached to the front casting 204.

The front side 202 of the electrical box 200 thereby provides an additional path for removal of heat from the housing 210. Namely, some of the heat from the heated air may transfer through the front casting 204 and the label 206 to the ambient air outside of the front side 202.

Typically, the front casting 204 and the label 206 are made of plastic. However, in accordance with an embodiment, one or both of the front casting 204 and the label 206 may be made of a metal to facilitate the transfer of heat from within the electrical box 200 to the outside of the front side 202.

The housing 210 of the electrical box 200 may be disposed within the back box 500. The back box 500 is configured to be mounted in an opening in a wall and includes a top surface 502 and an opposing bottom surface 504. A pair of side surfaces 506 and 508 are located on respective sides of the back box 500. A rear surface 510 disposed between the back ends of the top surface 502 and the bottom surface 504.

One or more knock out plates may be formed in some or all of the top, bottom, side, and rear surfaces. For example, the top surface 502 may include a knock out plate 512, the side surface 516 may include one or more knock out plates 516, and the other surfaces may include other knock out plates (not shown). The knock out plate 512 is typically removed to form an exhaust opening in the top surface 502 that permits the heated air exiting through the top holes 240 of the housing 210 to exit the back box 500. An additional knock out plate (not shown) located on the rear surface 510 of the back box 500 is also removed to provide an intake opening in the rear surface 510 that allows cooling air to be drawn by the fan 260 into the back box 500.

FIG. 5B is a perspective view showing a mounting plate 520 disposed atop the mounting plate 232 of the housing 210 and surrounding the front casting 204 and the label 206 of the electrical box 200. A touch plate 522 is attached to the front of the mounting plate 520.

The mounting plate 520 is also in thermal contact with the housing 210 of the electrical box 200 and provides an additional path for removal of heat from the housing 210. Namely, some of the heat generated from within the electrical box 200, such as by electronic circuitry or other elements within the electrical box 200, may transfer through the mounting plate 520 and then through the touch plate 522 to the ambient air outside of the touch plate 522.

Typically, the mounting plate 520 and the touch plate 522 are made of plastic. However, in accordance with an embodiment, one or both of the front the mounting plate 520 and the touch plate 522 may be made of a metal, such as aluminum, to facilitate the transfer of heat from within the electrical box 200 to the ambient air.

FIG. 6 shows a side view of the back box 500 mounted in an opening in a wall 602, according to the embodiment. The back box 500 is disposed within a cavity 606 formed between the wall 602 and a further wall 604. The top, bottom, rear, and side surfaces 502, 504, 506, 508 and 510 of the housing 500 are each open to ambient air surrounding the cavity 606.

In operation, the fan 260 draws cooling air 610 from the cavity 606. The air is drawn by the fan 260 through the intake opening in the rear wall 510 of the back box 500 and then through the fan hole 250 of the housing 210 into the interior of the housing. The cooling air is then circulated within the housing 210.

Heated air 620 then exits from the housing 210 through the vent holes 240, 242 in the housing 210. The heated air 620 thereafter exits the back box 500 through the exhaust opening in the top surface 502.

After exiting the back box 500, the heated air 620 then circulates upward by convection within the cavity 606. The heated air 620 is then re-cooled by contact with one of the walls 602, 604, which are typically at room temperature. The re-cooled air 622, being heavier than the heated air 620, then travels downward and may again be drawn by the fan 260 back through the intake opening in the rear wall 510 of the back box 500 and then into the fan hole 250 of the housing 210 to again remove heat from the components located within the housing 210.

In this manner, cooling air is continually circulated to cool the components located within the housing 210.

FIG. 7 shows an alternative electrical box 700 according to another embodiment. Here, the intermediate surfaces shown in FIGS. 2-5 are omitted.

The electrical box 700 includes a housing 710 having a top surface 712, a bottom surface 714, a rear surface 720 disposed between the top surface 712 and the bottom surface 714 at the ends thereof, and side surfaces 716 and 718 disposed between the top surface 712 and the bottom surface 714 at their side edges.

A plurality of top vent holes 740 are formed in the top surface 712. Additionally, a plurality of side vent holes 742 may be formed in one or both of the side surfaces 716 and 718.

In accordance with the embodiment, the rear surface 720 includes an opening or fan hole 750 over which a cooling fan, such as the fan 260 shown in FIG. 5, may be located. The rear surface 720 further includes mounting holes 752 which may be threaded for receiving screws to secure the fan to the rear surface 720.

FIGS. 8A and 8B show an example of heat flow 800 from a heat source to the external environment according to an embodiment.

As shown at 802, the heat source, which may be electronic circuitry or other elements within the electrical box 200, is disposed within the housing 210 of the electrical box 200. Then, as shown at 804, the heat from the heat source passes through a thermal interface material and, as shown at 806, to a heat sink. Next, as shown at 808, the heat is drawn from the heat sink by convection of air inside the housing of the electrical box.

Additionally, as shown at 810, the heat may also be drawn from the heat sink by the sheet metal that forms the top surface 212 of the housing 210, as well as by the bottom, rear, and side outer surfaces 214, 216, 218, 220 of the housing 210 of the electrical box 200. Then, as shown at 812, the heated sheet metal outer surfaces of the housing 210 of the electrical box 200 heats the surrounding air, and the heated air then travels via convection to the walls of the back box 500 and then heats the air surrounding the back box, namely, the air in the cavity 606 formed between the walls 602, 604.

Further, as shown at 814, heat may be drawn from the housing 210 of the electrical box 200 through a gasket disposed between the mounting plate 232 of the electrical box and the front casting 204 of the electrical box 200. According to an embodiment, the gasket may be made of EMI or another thermal interface material that facilitates the transfer of heat. The heat carried in this manner travels to the front casting 204 of the electrical box, as shown at 816. Then, as shown at 818, the heat may travel to the front label 206 and, as shown at 820, heats the ambient air surrounding the front label 206. The heated air then travels via convection into the surroundings of the front 202 of the electrical box 200.

Also, as shown at 822, the heat may travel from the front casting 204 of the electrical box 200 to the mounting plate 520. Next, as shown at 824, the heat may travel from the mounting plate 520 to the touch plate 522. Then, as shown at 826, the heat from the touch plate 522 heats the ambient air surrounding the touch plate 522. The heated air then travels via convection to the surroundings of the front 202 of the electrical box 200.

Additionally, as shown at 830, according to an embodiment, the convection of the heated air inside the housing is also driven by the fan 260 mounted on the rear surface 220 of the housing 210 of the electrical box 200. As shown at 832, the heated air may travel to the top surface 212 of the housing 210 and then through the openings 240 in the top surface 212 of the housing. The heated air may then, as shown at 834, flow via convection to the back box 500. The heated air then travels through the knocked out opening in the top surface 502 of the back box 500 into the ambient air surrounding the back box, namely, into the cavity 606 formed between the two walls 602, 604. The heated air may then circulate within the cavity 606 in the manner described above in connection with FIG. 6.

In the various embodiments described above, thermal management of the circuitry inside the housing of the electrical box is improved. For example, thermal management of the circuitry inside the housing of the electrical box may be improved by providing an axial fan to drive cooling air. Further, thermal management of the circuitry inside the housing of the electrical box may be improved using a metal plate in place of plastic. Moreover, thermal management of the circuitry inside the housing of the electrical box may be improved using a gasket made of a thermal interface material.

FIG. 9 is a cross-sectional side view of the known electrical box 100 of FIG. 1 when the electrical box 100 is mounted in a known back box 900. The back box 900 is, in turn, mounted inside a wall cavity 922.

The electrical box 100 includes the housing 110 having the top surface 112, the opposing bottom surface 114, and the rear surface 120 disposed between the top surface 112 and the bottom surface 114. The side surfaces (not shown) are disposed between the side edges of the top surface 112 and the bottom surface 114. The housing 110 of the electrical box 100 is configured to be inserted inside a cavity within the back box 900.

The back box 900 includes a top inner wall 902 and an opposing bottom inner wall 904. A rear inner wall 906 is disposed between the back ends of the top inner wall 902 and the bottom inner wall 904. A pair of side surfaces (not shown) are located on respective sides of the back box 900. The back box 900 is configured to be mounted in a wall cavity 922 disposed behind a wall 920.

When the housing 110 of the electrical box 100 is inserted inside the cavity within the back box 900, the surfaces 112, 114, 116, . . . of the housing 110 typically do not have the same dimensions as the inner walls 902, 904, 906, . . . that respectively face these surfaces. As a result, one or more air gaps may be present between the surfaces 112, 114, 116, . . . of the housing 110 and the inner walls 902, 904, 906, . . . of the back box 900. For example, an air gap 952 may be present between the top surface 112 of the housing 110 and the adjacent inner wall 902 of the back box 900. Moreover, an air gap 954 may be present between the bottom surface 114 of the housing 110 and the adjacent inner wall 904 of the back box 900. Further, an air gap 950 may be present between the rear surface 120 of the housing 110 and the adjacent inner wall 906 of the back box 900. Also, one or more other air gaps (not shown) may be present between one or both of the side surfaces of the housing 110 and the inner walls of the back box that are adjacent to these surfaces. The presence of such air gaps inhibit the heat generated by the circuitry of the electronics box 100 from flowing from the housing 110 to the back box 900.

According to an embodiment, a passive cooling arrangement is provided, using a thermal interface material to facilitate the conduction of heat away from an electronics box to a back box. As FIGS. 10A and 10B show, a passive cooling arrangement 1000 enables the flow of heat from electrical box housing 1010 to a back box 1040 in accordance with an embodiment.

A thermal interface material 1030 is provided to provide one or more paths for heat to flow from the housing 1010 to the back box 1040 in which the housing is mounted. The mounting location of the thermal interface material 1030 is dependent on the location of an air gap between a given surface of the housing 1010 and the back box inner wall to which it is adjacent. For example, the thermal interface material 1030 may be mounted on the back surface 1020 of the housing 1010 so that when the housing 1010 is mounted inside the back box 1040, the thermal interface material 1030 fills in the air gap between the side surface 1020 and the inner wall 1046 of the back box adjacent to it. The thermal interface material 1030 therefore provides a path for heat to flow from the back surface 1020 of the housing 1010 to the adjacent inner wall 1046 of the back box. The thermal interface material 1030 may be employed to fill in only part of the air gap, as FIG. 10B shows, or to fill in the entire air gap.

Similarly, the thermal interface material 1030 may be mounted on one of more of the top surface 1012, the bottom surface 1014, or the side surface 1016, to fill in at least part of the air gap between that surface and its adjacent inner wall 1042, 1044 of the back box 1040. The thermal interface material 1030 therefore provides a path for heat to flow from that surface of the housing 1010 to the adjacent inner wall of the back box 1040.

Alternatively, the thermal interface material 1030 may be mounted on one or more of the inner wall of the back box 1040 depending on the location of air gap. When the housing 1010 is mounted inside the back box 1040, the thermal interface material 1030 fills in at least part of the air gap between that inner wall and the adjacent surface of the housing and provides a path for heat to flow from the adjacent surface of the housing 1010 to the that wall of the back box 1040.

The thermal interface material 1030 may be a thermally conducting pad, a thermally conducting putty, or another thermally conducting material.

FIGS. 11A and 11B show another passive cooling arrangement in which one or more expandable, thermally conductive elements, such as metal spring finger elements, are employed to facilitate the conduction of heat away across an air gap between an electronics box and a back box. More specifically, FIGS. 11A and 11B show a passive cooling arrangement 1100 for the flow of heat from a housing 1110 of an electrical box to a back box 1140 according to another embodiment.

As FIG. 11A shows, expandable, thermally conductive elements 1130 are mounted on one or more of the surfaces of the housing 1110. As FIG. 11B shows, the expandable, thermally conductive elements each provide a respective path for heat to flow from the housing 1110 to the back box 1140. The location where the expandable, thermally conductive elements 1130 are mounted on the housing is dependent on the location of the air gap the housing 1110 and the back box 1140. For example, one or more expandable, thermally conductive elements 1130 may be mounted on the top surface 1112 of the housing 1110 so that when the housing 1110 is mounted inside the back box 1140, each thermally conductive element 1130 expands to provide a thermal path between the side surface 1112 and the adjacent inner wall 1142 of the back box. A single expandable, thermally conductive element 1130 may be employed or a plurality of expandable, thermally conductive elements 1130 may be used.

As another example, the expandable, thermally conductive elements 1130 may be mounted on the back surface 1120 of the housing 1110 to provide a path for heat to flow from the back surface 1120 of the housing 1110 to the adjacent inner wall 1146 of the back box. Similarly, the expandable, thermally conductive elements 1130 may be mounted on one of more of the other surface of the housing 1110 and provide a heat flow path between that surface and the adjacent inner wall of the back box 1140.

Alternatively, one or more of the expandable, thermally conductive elements 1130 may be mounted on the inner wall of the back box 1140 so that when the housing 1110 is mounted inside the back box 1140, the expandable, thermally conductive element 1130 similarly provides a path for heat to flow from the housing 1110 to the back box 1140.

The expandable, thermally conductive element 1130 may be a spring finger of any of various configurations.

In the various embodiments described above, thermal management of the circuitry inside the housing of the electrical box is improved. For example, thermal management of the circuitry inside the housing of the electrical box may be improved by providing an axial fan to drive cooling air. Further, thermal management of the circuitry inside the housing of the electrical box may be improved using a metal plate in place of plastic. Moreover, thermal management of the circuitry inside the housing of the electrical box may be improved using a thermal interface material or a spring finger element.

INDUSTRIAL APPLICABILITY

To solve the aforementioned problems, the present embodiments provide an electrical box having improved thermal management.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. An apparatus for cooling electronic circuitry, the apparatus comprising:
   (a) a housing configured to enclose the electronic circuitry and being mountable inside a back box, the housing including
      (1) a plurality of surfaces, each one of the plurality of surfaces being configured to face an adjacent one of a plurality of inner walls of the back box upon the housing being mounted inside the back box, the plurality of surfaces including
         (A) a rear surface configured to face a rear wall of the plurality of inner walls of the back box upon the housing being mounted inside the back box;
   (b) a mounting plate disposed opposite to the rear surface, the mounting plate being in thermal contact with the housing and being configured to face away from the back box upon the housing being mounted inside the back box; and
   (c) a touch plate disposed atop of, and in thermal contact with, the mounting plate, wherein
      (1) the mounting plate and the touch plate combine to provide a path for conducting heat generated by the electronic circuitry away from the housing and for radiating the heat to ambient air, and
      (2) one of the mounting plate or the touch plate is made of a material that has a higher thermal conductivity than another of the mounting plate or the touch plate to facilitate the conduction of the heat away from the housing.

2. The apparatus of claim 1, wherein
(a) the one of the mounting plate or the touch plate is made of a metal, and
(b) the another of the mounting plate or the touch plate is made of a plastic.

3. The apparatus of claim 2, wherein
(a) the one of the mounting plate or the touch plate is made of aluminum.

4. An apparatus for cooling electronic circuitry, the apparatus comprising:
(a) a housing configured to enclose the electronic circuitry and being mountable inside a back box, the housing including
   (1) a plurality of surfaces, each one of the plurality of surfaces being configured to face an adjacent one of a plurality of inner walls of the back box upon the housing being mounted inside the back box, the plurality of surfaces including
      (A) a rear surface configured to face a rear wall of the plurality of inner walls of the back box upon the housing being mounted inside the back box;
(b) a front casting disposed opposite to the rear surface and configured to face away from the back box upon the housing being mounted inside the back box, the front casting being in thermal contact with the housing thereby providing a path for conducting heat generated by the electronic circuitry away from the housing and radiating the heat to ambient air;
(c) a mounting plate surrounding the front casting and being in further thermal contact with the housing; and
(d) a touch plate disposed atop of, and in thermal contact with, the mounting plate, wherein
   (1) the mounting plate and the touch plate combine to provide a further path for conducting the heat generated by the electronic circuitry away from the housing and for radiating the heat to ambient air, and
   (2) one of the mounting plate or the touch plate is made of a material that has a higher thermal conductivity than another of the mounting plate or the touch plate to facilitate the conduction of the heat away from the housing.

5. The apparatus of claim 4, further comprising
(a) a label disposed atop of, and in thermal contact with, the front casting the label and the front casting combining to provide the path for conducting the heat generated by the electronic circuitry away from the housing and for radiating the heat to ambient air.

6. The apparatus of claim 4, wherein
(a) the front casting and the one of the mounting plate or the touch plate are made of metals.

7. An apparatus for cooling electronic circuitry, the apparatus comprising:
(a) a housing configured to enclose the electronic circuitry and being mountable inside a back box, the housing including
   (1) a plurality of surfaces, each one of the plurality of surfaces being configured to face an adjacent one of a plurality of inner walls of the back box upon the housing being mounted inside the back box, the plurality of surfaces including
      (A) a rear surface configured to face a rear wall of the plurality of inner walls of the back box upon the housing being mounted inside the back box;
(b) a front casting disposed opposite to the rear surface and configured to face away from the back box upon the housing being mounted inside the back box, the front casting being in thermal contact with the housing and being made of a metal;
(c) a label disposed atop of, and in thermal contact with, the front casting, wherein
   (1) the label and the front casting combine to provide a path for conducting heat generated by the electronic circuitry away from the housing and for radiating the heat to ambient air;
(d) a mounting plate surrounding the front casting and being in further thermal contact with the housing; and
(e) a touch plate disposed atop of, and in thermal contact with, the mounting plate, wherein
   (1) the mounting plate and the touch plate combine to provide a further path for conducting the heat generated by the electronic circuitry away from the housing and for radiating the heat to ambient air, and
   (2) one of the mounting plate or the touch plate is made of a metal to facilitate the conduction of the heat away from the housing.

8. An apparatus for cooling electronic circuitry, the apparatus comprising:
(a) a housing configured to enclose the electronic circuitry and being mountable inside a back box, including
   (1) a plurality of surfaces, at least one of the plurality of surfaces being configured to face an adjacent one of a plurality of inner walls of the back box upon the housing being mounted inside the back box, whereby an air gap is formed between that surface and its adjacent one of the plurality of inner walls; and
(b) a thermal interface material disposed on one of the at least one of the plurality of surfaces or the at least one adjacent inner wall of the back box, wherein
   (1) upon the housing being mounted inside the back box, the thermal interface material fills at least part of the air gap formed between the at least one of the plurality of surfaces of the housing and its adjacent inner wall of the back box and thereby provides a path for heat generated by the circuitry to flow from the housing to the back box.

9. The apparatus of claim 8, wherein
(a) the thermal interface material includes at least one of
   (1) a thermally conducting pad, or
   (2) a thermally conducting putty.

10. The apparatus of claim 8, wherein
(a) the plurality of surfaces comprises
   (1) a top surface,
   (2) a bottom surface disposed opposite to the top surface,
   (3) opposing first and second side surfaces each extending between the top surface and the bottom surface, and
   (4) a rear surface extending between the top surface and the bottom surface, wherein
      (A) each one of the top surface, the bottom surface, the first side surface, the second side surface, and the rear surface is configured to face a corresponding adjacent one of the plurality of inner walls of the back box upon the housing being mounted inside the back box,
(b) the air gap is formed between at least one of the of the top surface, the bottom surface, the first side surface, the second side surface, and the rear surface of the housing and its adjacent one of the plurality of inner walls, and
(c) the thermal interface material is disposed on at least one of (1) the at least one of the top surface, the bottom surface, the first side surface or the second side surface of the housing, or
(2) its adjacent inner wall of the back box.

11. An apparatus for cooling electronic circuitry, the apparatus comprising:
(a) a housing configured to enclose the electronic circuitry and being mountable inside a back box, the housing having a plurality of surfaces, including
(1) a top surface,
(2) a bottom surface disposed opposite to the top surface,
(3) opposing first and second side surfaces each extending between the top surface and the bottom surface,
(4) a rear surface extending between the top surface and the bottom surface, wherein
(A) each of the top surface, the bottom surface, the first side surface, the second side surface, and the rear surface is configured to face a corresponding adjacent one of a plurality of inner walls of the back box when the housing is mounted inside the back box, and
(B) at least one of the of the top surface, the bottom surface, the first side surface, the second side surface, and the rear surface of the housing forms an air gap between that surface and its adjacent one of the plurality of inner walls; and
(b) a thermal interface material disposed on at least one of
(1) the at least one of the of the top surface, the bottom surface, the first side surface, the second side surface, and the rear surface of the housing, or
(2) the at least one adjacent inner wall of the back box,
(A) wherein
(i) upon the housing being mounted inside the back box, the thermal interface material fills at least part of the air gap and thereby provides a path for heat generated by the circuitry to flow from the housing to the back box.

12. An apparatus for cooling electronic circuitry, the apparatus comprising:
(a) a housing configured to enclose the electronic circuitry and being mountable inside a back box, the housing including
(1) a plurality of surfaces, at least one of the plurality of surfaces being configured to face an adjacent one of a plurality of inner walls of the back box upon the housing being mounted inside the back box, whereby an air gap is formed between the at least one of the plurality of surfaces and an adjacent one of the plurality of inner walls; and
(b) at least one expandable, thermally conductive element mounted on one of (i) the at least one of the plurality of surfaces of the housing or (ii) the adjacent one of the plurality of inner walls of the back box, wherein
(1) upon the housing being mounted inside the back box, the at least one expandable, thermally conductive element expands across the air gap and provides a path for heat generated by the electronic circuitry to flow from the housing to the back box.

13. The apparatus of claim 12, wherein
(a) a plurality of expandable, thermally conductive elements are mounted on the one of (i) the at least one of the plurality of surfaces of the housing or (ii) the adjacent one of the plurality of inner walls of the back box, and
(b) wherein upon the housing being mounted inside the back box, each one of the plurality of expandable, thermally conductive element expands across the air gap and provides a respective path for the heat generated by the electronic circuitry to flow from the housing to the back box.

14. The apparatus of claim 12, wherein
(a) the at least one expandable, thermally conductive element includes at least one thermally conductive, spring finger element.

15. The apparatus of claim 14, wherein
(a) the at least one thermally conductive, spring finger element is mounted on the at least one of the plurality of surfaces of the housing, and
(b) upon the housing being mounted inside the back box, the at least one thermally conductive, spring finger element expands across the air gap, and presses against the adjacent inner wall of the back box to provide the path for heat generated by the electronic circuitry to flow from the housing to the back box.

16. The apparatus of claim 14, wherein
(a) the at least one thermally conductive, spring finger element is comprised of beryllium-copper.

17. An apparatus for cooling electronic circuitry, the apparatus comprising:
(a) a housing configured to enclose the electronic circuitry and being mountable inside a back box, the housing including
(1) a plurality of surfaces, at least one of the plurality of surfaces being configured to face an adjacent one of a plurality of inner walls of the back box upon the housing being mounted inside the back box, whereby an air gap is formed between that surface of the housing and its adjacent one of the plurality of inner walls; and
(b) a plurality of expandable, thermally conductive elements mounted on the at least one of the plurality of surfaces of the housing,
(1) wherein upon the housing being mounted inside the back box, each of the plurality of expandable, surface mountable thermally conductive elements expands across the air gap, presses against the adjacent inner wall of the back box, and thereby provides a path for the heat generated by the electronic circuitry to flow from the housing to the back box.

18. The apparatus of claim 17, wherein
(a) the plurality of expandable, surface mountable thermally conductive elements includes a plurality of thermally conductive, spring finger elements.

19. The apparatus of claim 18, wherein
(a) the plurality of thermally conductive, spring finger elements is comprised of beryllium-copper.

20. An apparatus for cooling electronic circuitry, the apparatus comprising:
(a) a housing configured to enclose the electronic circuitry and being mountable inside a back box, the housing including
(1) a top surface,
(2) a bottom surface disposed opposite to the top surface,
(3) opposing first and second side surfaces each extending between the top surface and the bottom surface, and
(4) a rear surface extending between the top surface and the bottom surface, wherein
(A) each of the top surface, the bottom surface, the first side surface, the second side surface, and the rear surface is configured to face an adjacent one of a plurality of inner walls of the back box when the housing is mounted inside the back box, and (B) at least one of the of the top surface, the bottom surface, the first side surface, the second side surface, and the rear surface of the housing forms an air gap between that surface of the housing and its adjacent one of the plurality of inner walls; and (b) a plurality of thermally conductive, spring finger elements mounted on one or more of the of the top surface, the bottom surface, the first side surface, the second side surface, and the rear surface of the housing, wherein (1) upon the housing being mounted inside the back box, the at least some of the plurality of thermally conductive, spring finger elements expand across the air gap, press against the adjacent inner wall of the back box, and thereby provide a path for the heat generated by the electronic circuitry to flow from the housing to the back box.

\* \* \* \* \*